United States Patent
Noma et al.

(10) Patent No.: US 8,766,408 B2
(45) Date of Patent: Jul. 1, 2014

(54) SEMICONDUCTOR DEVICE AND MANUFACTURING METHOD THEREOF

(75) Inventors: Takashi Noma, Gunma (JP); Shigeki Otsuka, Chiba (JP); Yuichi Morita, Kanagawa (JP); Kazuo Okada, Gunma (JP); Hiroshi Yamada, Gunma (JP); Katsuhiko Kitagawa, Gunma (JP); Noboru Okubo, Saitama (JP); Shinzo Ishibe, Gunma (JP); Hiroyuki Shinogi, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 523 days.

(21) Appl. No.: 11/714,906

(22) Filed: Mar. 7, 2007

(65) Prior Publication Data

US 2007/0210437 A1 Sep. 13, 2007

(30) Foreign Application Priority Data

Mar. 7, 2006 (JP) ................................. 2006-061713
Aug. 4, 2006 (JP) ................................. 2006-213483

(51) Int. Cl.
*H01L 21/00* (2006.01)

(52) U.S. Cl.
USPC ........... 257/621; 257/686; 257/777; 257/778; 257/737

(58) Field of Classification Search
None
See application file for complete search history.

(56) References Cited

U.S. PATENT DOCUMENTS

| | | | | |
|---|---|---|---|---|
| 3,648,131 A | * | 3/1972 | Stuby | 257/622 |
| 4,807,021 A | * | 2/1989 | Okumura | 257/777 |
| 4,851,481 A | | 7/1989 | Kuriyama et al. | |
| 4,954,875 A | * | 9/1990 | Clements | 257/686 |
| 4,984,358 A | * | 1/1991 | Nelson | 438/109 |
| 5,229,647 A | * | 7/1993 | Gnadinger | 257/785 |
| 5,420,460 A | | 5/1995 | Massingill | |
| 5,424,245 A | * | 6/1995 | Gurtler et al. | 438/107 |
| 5,432,999 A | * | 7/1995 | Capps et al. | 438/109 |
| 5,463,246 A | * | 10/1995 | Matsunami | 257/621 |

(Continued)

FOREIGN PATENT DOCUMENTS

| | | |
|---|---|---|
| EP | 1 471 571 | 10/2004 |
| JP | 10-163250 | 6/1998 |

(Continued)

OTHER PUBLICATIONS

Partial European Search Report mailed Oct. 23, 2007, directed to counterpart EP application No. 07004724.6.

(Continued)

*Primary Examiner* — David E Graybill

(57) ABSTRACT

A packaged semiconductor device is manufactured by a simplified manufacturing process, and is reduced in cost, in thickness and in size. A device component and a pad electrode connected with the device component are formed on a semiconductor substrate. A supporter is bonded to a top surface of the semiconductor substrate through an adhesive layer. Then, there is formed a protection layer that has an opening at a location corresponding to the pad electrode and covers a side surface and a back surface of the semiconductor substrate. A conductive terminal is formed on the pad electrode at the location corresponding to the opening formed in the protection layer. No wiring layer or conductive terminal is formed on the back surface of the semiconductor substrate. A conductive terminal is formed on a periphery of the supporter outside of and next to the side surface of the semiconductor substrate.

11 Claims, 14 Drawing Sheets

(56) References Cited

U.S. PATENT DOCUMENTS

| | | | |
|---|---|---|---|
| 5,608,264 A * | 3/1997 | Gaul | 257/734 |
| 5,618,752 A * | 4/1997 | Gaul | 438/626 |
| 5,646,067 A * | 7/1997 | Gaul | 438/458 |
| 5,814,889 A * | 9/1998 | Gaul | 257/773 |
| 5,841,197 A * | 11/1998 | Adamic, Jr. | 257/777 |
| 5,872,025 A * | 2/1999 | Cronin et al. | 438/109 |
| 6,087,719 A * | 7/2000 | Tsunashima | 257/686 |
| 6,124,179 A * | 9/2000 | Adamic, Jr. | 438/309 |
| 6,322,903 B1 * | 11/2001 | Siniaguine et al. | 428/617 |
| 6,350,386 B1 * | 2/2002 | Lin | 216/13 |
| 6,350,632 B1 * | 2/2002 | Lin | 438/107 |
| 6,383,837 B1 * | 5/2002 | Tsunashima | 438/106 |
| 6,388,333 B1 | 5/2002 | Taniguchi et al. | |
| 6,420,209 B1 * | 7/2002 | Siniaguine | 438/108 |
| 6,437,424 B1 * | 8/2002 | Noma et al. | 257/639 |
| 6,440,835 B1 * | 8/2002 | Lin | 438/611 |
| 6,444,489 B1 * | 9/2002 | Lin | 438/107 |
| 6,448,108 B1 * | 9/2002 | Lin | 438/107 |
| 6,448,647 B1 * | 9/2002 | Kurita et al. | 257/738 |
| 6,451,626 B1 * | 9/2002 | Lin | 438/108 |
| 6,461,956 B1 * | 10/2002 | Hsuan et al. | 438/622 |
| 6,492,252 B1 * | 12/2002 | Lin et al. | 438/612 |
| 6,509,639 B1 * | 1/2003 | Lin | 257/686 |
| 6,522,022 B2 * | 2/2003 | Murayama | 257/786 |
| 6,537,851 B1 * | 3/2003 | Lin et al. | 438/107 |
| 6,544,813 B1 * | 4/2003 | Lin | 438/107 |
| 6,548,393 B1 * | 4/2003 | Lin | 438/618 |
| 6,552,426 B2 * | 4/2003 | Ishio et al. | 257/692 |
| 6,576,493 B1 * | 6/2003 | Lin et al. | 438/107 |
| 6,576,539 B1 * | 6/2003 | Lin | 438/611 |
| 6,583,040 B1 * | 6/2003 | Lin | 438/612 |
| 6,608,374 B1 * | 8/2003 | Lin et al. | 257/690 |
| 6,627,824 B1 * | 9/2003 | Lin | 174/268 |
| 6,639,303 B2 * | 10/2003 | Siniaguine | 257/621 |
| 6,653,170 B1 * | 11/2003 | Lin | 438/117 |
| 6,653,217 B1 * | 11/2003 | Lin | 438/612 |
| 6,653,742 B1 * | 11/2003 | Lin | 257/783 |
| 6,664,129 B2 * | 12/2003 | Siniaguine | 438/107 |
| 6,667,229 B1 * | 12/2003 | Lin et al. | 438/611 |
| 6,699,780 B1 * | 3/2004 | Chiang et al. | 438/612 |
| 6,717,254 B2 * | 4/2004 | Siniaguine | 257/690 |
| 6,740,576 B1 * | 5/2004 | Lin et al. | 438/611 |
| 6,765,287 B1 * | 7/2004 | Lin | 257/686 |
| 6,794,741 B1 * | 9/2004 | Lin et al. | 257/686 |
| 6,809,414 B1 * | 10/2004 | Lin et al. | 257/692 |
| 6,809,421 B1 * | 10/2004 | Hayasaka et al. | 257/777 |
| 6,844,241 B2 * | 1/2005 | Halahan et al. | 438/454 |
| 6,864,172 B2 * | 3/2005 | Noma et al. | 438/674 |
| 6,882,030 B2 * | 4/2005 | Siniaguine | 257/621 |
| 6,897,148 B2 * | 5/2005 | Halahan et al. | 438/612 |
| 6,908,788 B1 * | 6/2005 | Lin | 438/106 |
| 6,911,392 B2 | 6/2005 | Bieck et al. | |
| 6,982,487 B2 * | 1/2006 | Kim et al. | 257/774 |
| 7,001,825 B2 * | 2/2006 | Halahan et al. | 438/456 |
| 7,009,297 B1 * | 3/2006 | Chiang et al. | 257/738 |
| 7,015,128 B1 * | 3/2006 | Chiang et al. | 438/612 |
| 7,067,911 B1 * | 6/2006 | Lin et al. | 257/686 |
| 7,071,089 B1 * | 7/2006 | Lin et al. | 438/612 |
| 7,071,573 B1 * | 7/2006 | Lin | 257/692 |
| 7,075,186 B1 * | 7/2006 | Wang et al. | 257/779 |
| 7,094,676 B1 * | 8/2006 | Leu et al. | 438/611 |
| 7,101,735 B2 * | 9/2006 | Noma et al. | 438/114 |
| 7,102,238 B2 * | 9/2006 | Noma et al. | 257/777 |
| 7,112,520 B2 * | 9/2006 | Lee et al. | 438/612 |
| 7,112,521 B1 * | 9/2006 | Lin et al. | 438/612 |
| 7,112,881 B2 * | 9/2006 | Kaida et al. | 257/698 |
| 7,115,972 B2 * | 10/2006 | Dotta et al. | 257/621 |
| 7,122,457 B2 * | 10/2006 | Tanida et al. | 438/612 |
| 7,129,113 B1 * | 10/2006 | Lin et al. | 438/109 |
| 7,129,575 B1 * | 10/2006 | Lin et al. | 257/696 |
| 7,132,741 B1 * | 11/2006 | Lin et al. | 257/696 |
| 7,190,080 B1 * | 3/2007 | Leu et al. | 257/778 |
| 7,208,340 B2 * | 4/2007 | Noma | 438/106 |
| 7,232,706 B1 * | 6/2007 | Wang et al. | 438/107 |
| 7,232,707 B1 * | 6/2007 | Wang et al. | 438/107 |
| 7,271,466 B2 * | 9/2007 | Noma et al. | 257/621 |
| 7,312,107 B2 * | 12/2007 | Noma et al. | 438/113 |
| 7,312,521 B2 * | 12/2007 | Noma et al. | 257/698 |
| 7,319,265 B1 * | 1/2008 | Wang et al. | 257/673 |
| 7,371,693 B2 * | 5/2008 | Suzuki et al. | 438/745 |
| 7,397,134 B2 * | 7/2008 | Noma | 257/778 |
| 7,413,931 B2 * | 8/2008 | Noma et al. | 438/114 |
| 7,414,319 B2 * | 8/2008 | Lin et al. | 257/779 |
| 7,419,851 B2 * | 9/2008 | Lin et al. | 438/107 |
| 7,456,083 B2 * | 11/2008 | Noma et al. | 438/460 |
| 2003/0214048 A1 * | 11/2003 | Wu et al. | 257/777 |
| 2004/0041260 A1 * | 3/2004 | Wood et al. | 257/734 |
| 2004/0235270 A1 | 11/2004 | Noma et al. | |
| 2004/0245530 A1 | 12/2004 | Kameyama et al. | |
| 2005/0003649 A1 | 1/2005 | Takao | |
| 2005/0176235 A1 | 8/2005 | Noma et al. | |
| 2005/0253211 A1 | 11/2005 | Minamio et al. | |
| 2006/0131736 A1 | 6/2006 | Jansman et al. | |
| 2007/0071970 A1 | 3/2007 | Koike et al. | |
| 2007/0131954 A1 | 6/2007 | Murayama et al. | |
| 2007/0177360 A1 | 8/2007 | Shiraishi et al. | |
| 2007/0210437 A1 * | 9/2007 | Noma et al. | 257/690 |
| 2008/0135967 A1 | 6/2008 | Kitagawa et al. | |
| 2009/0290474 A1 | 11/2009 | Kimura et al. | |
| 2010/0164086 A1 | 7/2010 | Noma et al. | |
| 2010/0326429 A1 | 12/2010 | Cumpston et al. | |

FOREIGN PATENT DOCUMENTS

| | | |
|---|---|---|
| JP | 10-256001 | 9/1998 |
| JP | 2001-85603 | 3/2001 |
| JP | 2001-223297 A | 8/2001 |
| JP | 2002-33440 | 1/2002 |
| JP | 2002-512436 | 4/2002 |
| JP | 2003-92375 | 3/2003 |
| JP | 2003-234431 | 8/2003 |
| JP | 2004-273561 | 9/2004 |
| JP | 2004-281963 | 10/2004 |
| JP | 2004-343088 | 12/2004 |
| JP | 2004-363380 | 12/2004 |
| JP | 2005-501414 | 1/2005 |
| JP | 2005-072554 A | 3/2005 |
| JP | 2005-79457 | 3/2005 |
| JP | 2005-123553 A | 5/2005 |
| JP | 2005-268701 | 9/2005 |
| JP | 2005-327893 | 11/2005 |
| JP | 2006-93367 | 4/2006 |
| JP | 2006-179718 | 7/2006 |
| JP | 2006-191126 | 7/2006 |
| JP | 2006-216657 | 8/2006 |
| JP | 2007-242813 | 9/2007 |
| WO | WO-99/40624 | 8/1999 |

OTHER PUBLICATIONS

International Search Report mailed Oct. 30, 2007, directed to International Patent Application No. PCT/JP2007/065575; 3 pages.

Kitagawa et al., U.S. Office Action mailed Jun. 21, 2010, directed to U.S. Appl. No. 11/942,506; 8 pages.

Kitagawa, K. et al., U.S. Office Action mailed Nov. 25, 2011, directed to U.S. Appl. No. 11/942,506; 9 pages.

Kitagawa et al., U.S. Office Action mailed Nov. 18, 2010, directed to U.S. Appl. No. 11/942,506; 8 pages.

Noma, T. et al., U.S. Office Action mailed May 13, 2011, directed to U.S. Appl. No. 12/376,917; 9 pages.

Kitagawa, K. et al., U.S. Office Action mailed Jun. 24, 2011, directed to U.S. Appl. No. 11/942,506; 8 pages.

* cited by examiner

SEMICONDUCTOR DEVICE AND MANUFACTURING METHOD THEREOF

CROSS-REFERENCE OF THE INVENTION

This application claims priority from Japanese Patent Application Nos. 2006-213483 and 2006-061713, the contents of which are incorporated herein by reference in their entirety.

BACKGROUND OF THE INVENTION

1. Field of the Invention

This invention relates to a semiconductor device and its manufacturing method, specifically to a packaged semiconductor device and its manufacturing method.

2. Description of the Related Art

A CSP (Chip Size Package) has received attention in recent years as a new packaging technology. The CSP means a small package having about the same outside dimensions as those of a semiconductor die packaged in it.

A BGA (Ball Grid Array) type semiconductor device has been known as a kind of CSP. The BGA type semiconductor device is provided with a plurality of ball-shaped conductive terminals that are electrically connected with pad electrodes disposed on a semiconductor substrate.

When the BGA type semiconductor device is mounted on electronic equipment, a semiconductor die housed in the BGA type semiconductor devise is electrically connected with an external circuit on a printed circuit board by bonding the conductive terminals to wiring patterns on the printed circuit board.

Such a BGA type semiconductor device is widely used because it has advantages in providing a large number of conductive terminals and in reducing size over other CSP type semiconductor devices such as an SOP (Small Outline Package) and a QFP (Quad Flat Package), which have lead pins protruding from their sides.

FIG. 22 is a cross-sectional view showing a structure of a conventional BGA type semiconductor device 110. A device component 101 such as a CCD (Charge Coupled Device) type image sensor or a CMOS type image sensor is formed in a top surface of a semiconductor substrate 100 made of silicon or the like. A pad electrode 102 is formed on the semiconductor substrate 100 through a first insulation film 103. A glass substrate 104, for example, is bonded to the top surface of the semiconductor substrate 100 through a resin layer 105 made of epoxy resin or the like. A second insulation film 106 made of a silicon oxide film or a silicon nitride film is formed on a side surface and a back surface of the semiconductor substrate 100.

A wiring layer 107 electrically connected with the pad electrode 102 is formed on the second insulation film 106. The wiring layer 107 is formed over the side surface and the back surface of the semiconductor substrate 100. A protection film 108 made of solder resist or the like is formed to cover the second insulation film 107 and the wiring layer 107. Openings are formed in the protection film 108 at predetermined regions on the wiring layer 107. There are formed ball-shaped conductive terminals 109 connected with the wiring layer 107 through the openings. The technology mentioned above is described in Japanese Unexamined Patent Publication No. 2002-512436.

In manufacturing the BGA type semiconductor devices, however, simplifying the manufacturing process and reducing the manufacturing cost have been required. In addition, reducing the thickness and the size of the BGA type semiconductor device has been required for higher packaging density. Also, there has been required a semiconductor device suitable for a small and high density stacked structure.

SUMMARY OF THE INVENTION

This invention is directed to solve the problems addressed above and has following features. This invention offers a semiconductor device including a semiconductor substrate, a supporter that is bonded to a top surface of the semiconductor substrate in a way that at least a portion of a periphery of the supporter extends off an edge of the semiconductor substrate, a connecting electrode disposed below the supporter and a protection layer having an opening above the connecting electrode and covering a side surface of the semiconductor substrate, while there is no wiring layer over a back surface of the semiconductor substrate.

This invention also offers a semiconductor device including a semiconductor substrate having an opening penetrating through the semiconductor substrate from its top surface to its back surface, a supporter bonded to the top surface of the semiconductor substrate, a connecting electrode disposed below the supporter and a protection layer having an opening above the connecting electrode and covering a side surface of the semiconductor substrate, while there is no wiring layer over the back surface of the semiconductor substrate.

This invention also offers the semiconductor device wherein the supporter has a through-hole that penetrates through the supporter from its top surface to its back surface.

This invention also offers a semiconductor device made of a plurality of the above-mentioned devices which are stacked and electrically connected with each other via the through-hole.

And a manufacturing method of a semiconductor device of this invention has following features. This invention offers a method of manufacturing a semiconductor device including providing a semiconductor substrate having a connecting electrode formed on a top surface of the semiconductor substrate through an insulation film, attaching a supporter to the top surface of the semiconductor substrate, exposing the connecting electrode by removing the semiconductor substrate and the insulation film and forming a protection layer having an opening above the connecting electrode, wherein no wiring layer is formed over a back surface of the semiconductor substrate.

This invention also offers the method of manufacturing the semiconductor device further including forming a through-hole in the supporter at a location corresponding to an electrode for connection with another device.

This invention offers the method of manufacturing the semiconductor device further including forming a conductive terminal in the through-hole.

This invention also offers the method of manufacturing the semiconductor device further including stacking a plurality of the semiconductor devices so that neighboring semiconductor devices are connected with each other through the conductive terminal formed in the through-hole.

DETAILED DESCRIPTION OF THE INVENTION

Figure 1:
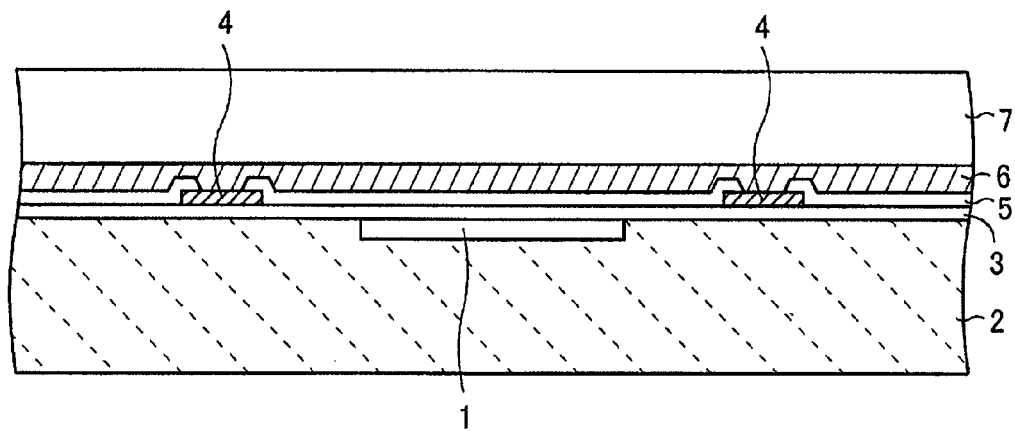
FIG. 1 is a cross-sectional view showing a semiconductor device and its manufacturing method according to a first embodiment of this invention.

A semiconductor device according to a first embodiment of this invention will be explained hereafter referring to the drawings. FIGS. 1, 2, 4, 5 and 6 are cross-sectional views showing the semiconductor device in a sequence of manufacturing process steps. Although the manufacturing process is applied to a wafer in which a plurality of the semiconductor devices is arrayed in a matrix bordered with dicing lines DL, only one of the semiconductor devices is described hereafter for the simplicity of explanation.

First, as shown in FIG. 1, there is provided a semiconductor substrate 2, made of silicon (Si) or the like, in a top surface of which a device component 1 (a CCD, a light-receiving device such as an infrared sensor, a light-emitting device or other semiconductor device, for example) is formed. The semiconductor substrate 2 is about 300-700 µm thick, for example. A first insulation film 3 (a silicon oxide film formed by thermal oxidation or CVD, for example) of a thickness of 2 µm, for example, is formed on the top surface of the semiconductor substrate 2.

Next, after a metal layer made of aluminum (Al), aluminum alloy or copper (Cu), for example, is formed by sputtering, plating or other film forming method, the metal layer is etched using a photoresist layer (not shown) as a mask to form pad electrodes 4 of a thickness of 1 µm, for example, on the first insulation film 3. The pad electrode 4 makes a connecting electrode for external connection, which is electrically connected with the device component 1 or its peripheral component through a wiring (not shown). The pad electrodes 4 are located on both sides of the device component 1 in FIG. 1. However, the pad electrode is not limited to be located as above, and may be located on the device component 1.

Next, a passivation film 5 (a silicon nitride film formed by CVD, for example) that covers portions of or all the pad electrodes 4 is formed over the top surface of the semiconductor substrate 2. The passivation film 5 shown in FIG. 1 is formed to cover portions of the pad electrodes 4.

Next, a supporter 7 is bonded to the top surface of the semiconductor substrate including the pad electrode 4 through an adhesive layer 6 made of epoxy resin, polyimide (photosensitive polyimide, for example), resist, acryl or the like.

The supporter 7 may be a film-shaped protection tape or made of glass, quartz, ceramic, metal, resin or the like. It is preferable that the supporter 7 is a rigid substrate in order to firmly support the semiconductor substrate of reducing thickness and to accommodate hands-free automatic transfer. The supporter 7 serves to support the semiconductor substrate 2 as well as protecting a surface of the component. When the device component 1 is a light-receiving device or a light-emitting device, the supporter 7 is to be made of transparent or semitransparent material to permit light to pass through.

Next, back grinding by a back surface grinder is applied to a back surface of the semiconductor substrate 2 to reduce the thickness of the semiconductor substrate 2 to a predetermined thickness (50 µm, for example). The back grinding may be replaced with etching, or a combination of grinding and etching. The back grinding may not be necessary, depending on usage or specifications of the final product or an initial thickness of the semiconductor substrate 2 being provided.

Figure 2:
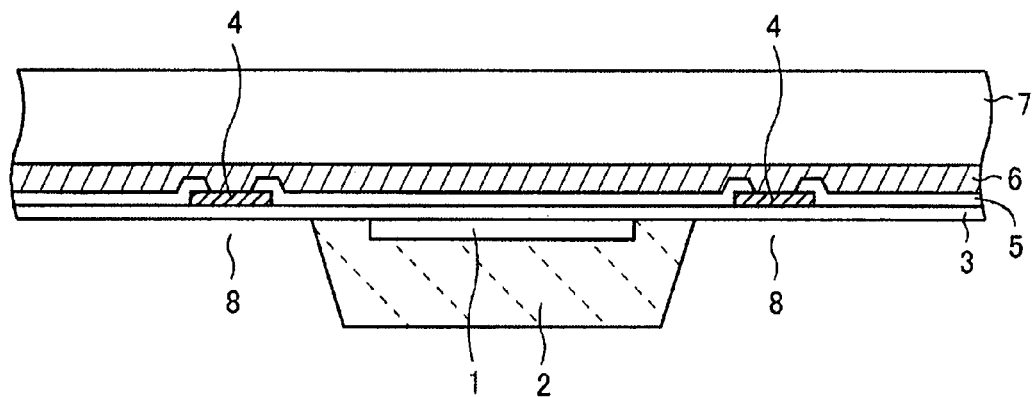
FIG. 2 is a cross-sectional view showing the semiconductor device and its manufacturing method according to the first embodiment of this invention.

Next, predetermined regions of the semiconductor substrate 2 corresponding to the pad electrodes 4 are selectively etched off from a side of the back surface of the semiconductor substrate 2 to expose portions of the first insulation film 3, as shown in FIG. 2. The exposed portions are hereafter referred to as openings 8.

Figure 3A:
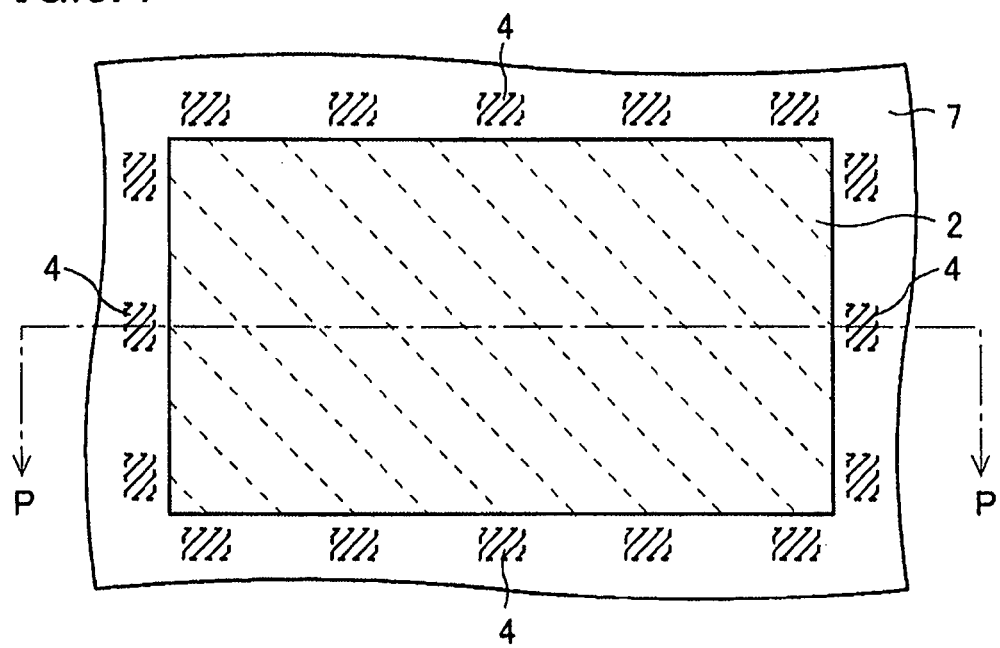
FIGS. 3A and 3B are plan views showing the semiconductor device and its manufacturing method according to the first embodiment of this invention.
Figure 3B:
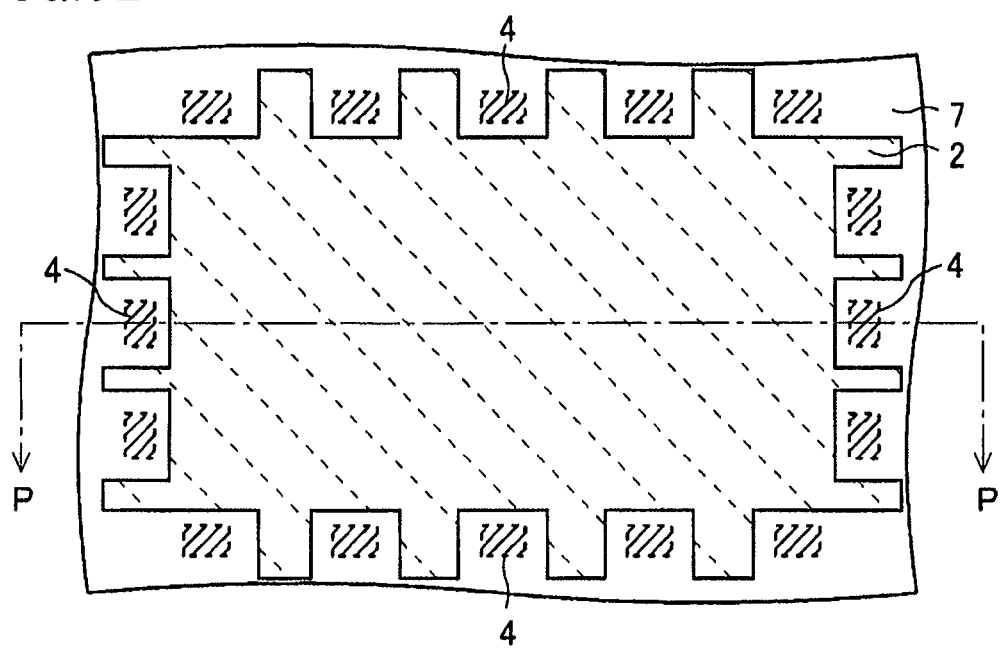

The selective etching of the semiconductor substrate 2 is explained referring to FIGS. 3A and 3B. FIGS. 3A and 3B are brief plan views seen from below (from a side of the semiconductor substrate 2). FIG. 2 corresponds to a cross-sectional view of a section P-P in FIGS. 3A and 3B.

The semiconductor substrate 2 may be etched to a shape of a rectangle narrower in width than the supporter 7, as shown in FIG. 3A. Or, the semiconductor substrate 2 may be shaped to have rugged periphery by etching off portions of the semiconductor substrate 2 in regions above which the pad electrodes 4 are formed, as shown in FIG. 3B. The latter has larger overlapping area between the semiconductor substrate 2 and the supporter 7 than the former and has the semiconductor substrate 2 extended close to a periphery of the supporter 7. Therefore, the latter is more preferable than the former from the standpoint of enhancing the strength of the supporter 7 to bolster the semiconductor substrate 2. Also, warping of the supporter 7 due to a difference in a coefficient of thermal expansion between the semiconductor substrate 2 and the supporter 7 can be prevented with a structure of the latter, thus cracks and separation in the semiconductor device can be thereby prevented. It is also possible to design the semiconductor substrate 2 in a planar shape different from both of the shapes shown in FIGS. 3A and 3B.

The semiconductor substrate 2 is etched in a way that sidewalls of the semiconductor substrate 2 are tapered down toward the back surface of the semiconductor substrate 2 in this embodiment. However, the semiconductor substrate 2 may also be etched in a way that the sidewalls of the semiconductor substrate 2 are perpendicular to a principal surface of the supporter 7 to keep a width of the semiconductor substrate 2 constant.

Figure 4:
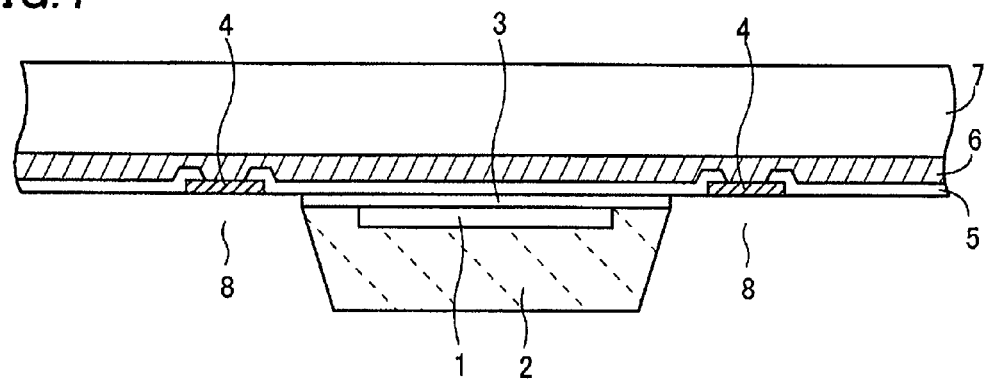
FIG. 4 is a cross-sectional view showing the semiconductor device and its manufacturing method according to the first embodiment of this invention.

Next, the first insulation film 3 is selectively etched using the semiconductor substrate 2 as a mask, as shown in FIG. 4. The first insulation film 3 in a region between an edge of the semiconductor substrate 2 and the corresponding dicing line DL is removed by the etching to expose a surface (a surface of the side of the semiconductor substrate 2) of the pad electrode 4 in a bottom of the opening 8. Selectively etching the first insulation film 3 is also possible by forming a photoresist layer and using the photoresist layer as a mask in the etching.

Figure 5:
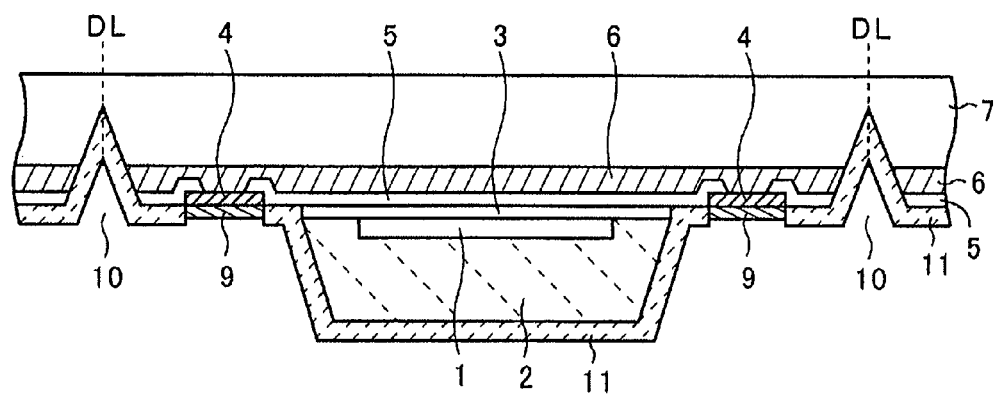
FIG. 5 is a cross-sectional view showing the semiconductor device and its manufacturing method according to the first embodiment of this invention.

Next, a metal layer 9 is formed on the exposed surface of the pad electrode 4, as shown in FIG. 5. The metal layer 9 is made of stacked layers of a nickel (Ni) layer and a gold (Au) layer, for example, and is formed by a lift-off method, that is, sputtering these metals sequentially using a photoresist layer as a mask followed by removing the photoresist layer, or by plating.

Materials forming the metal layer 9 may be modified corresponding to a material forming a conductive terminal 12 that is to be formed or a material forming an electrode of another device. That is, the metal layer 9 may be made of a titanium (Ti) layer, a tungsten (W) layer, a copper (Cu) layer, a tin (Sn) layer or the like, other than the nickel layer and the gold layer. The metal layer 9 may be made of any material as long as the material has functions to electrically connect the pad electrode 4 with the conductive terminal 12 or the electrode of the another device and to protect the pad electrode 4, and may be made of a single layer or stacked layers. Examples of the stacked layers include nickel/gold layers, titanium/nickel/copper layers, titanium/nickel-vanadium/copper layers.

Next, portions of the supporter 7 are removed from the side of the semiconductor substrate 2 by dicing or etching to form V-shaped grooves (notches), for example, along the dicing lines DL.

Next, there is formed a protection layer 11 of a thickness of 10 μm having an opening at each location corresponding to the pad electrode 4 and the metal layer 9. The opening is formed on a principal surface of the pad electrode 4 on the side of the semiconductor substrate 2.

The protection layer 11 is formed as follows. First, an organic material such as a polyimide resin or a solder resist is applied over the entire surface and a thermal treatment (pre-bake) is performed. Then, the applied organic material is exposed to light and developed to form openings that expose a surface of the metal layer 9. After that, another thermal treatment (post-bake) is performed to obtain the protection layer 11 having the opening at each location corresponding to the pad electrode 4 and the metal layer 9.

Figure 6:
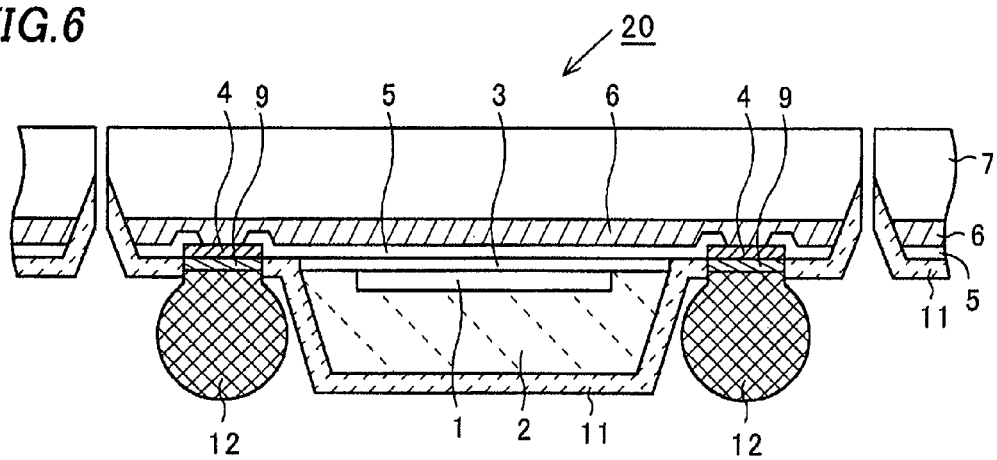
FIG. 6 is a cross-sectional view showing the semiconductor device and its manufacturing method according to the first embodiment of this invention.

Next, a conductive material (solder paste, for example) 9 is screen-printed on the metal layer 9 exposed in the openings in the protection layer 11. Ball-shaped conductive terminals 12 are formed by subsequent thermal treatment to reflow the conductive material, as shown in FIG. 6. The conductive terminals 12 in this embodiment are formed at locations corresponding to the pad electrodes 4 along the periphery of the supporter 7. The conductive terminals 12 are adjacent the sidewall of the semiconductor substrate 2, and protruding perpendicular to the supporter 7. A height of the conductive terminals 12 is approximately equal to or slightly larger than the thickness of the semiconductor substrate 2.

The conductive terminals 12 are not limited to being formed by the method described above, and may be formed by electrolytic plating using the metal layer 9 as a plating electrode or by a so-called dispense method (coating method) in which the solder paste or the like is coated using a dispenser. The conductive terminals 12 may be made of gold, copper or nickel, and is not limited to a specific material. And there is a case to be described in which the conductive terminal 12 is not formed. In this case, the metal layer 9 or the pad electrode 4 is exposed in the opening in the protection layer 11.

Finally, the supporter 7 is divided along the dicing lines DL so that each individual semiconductor device 20 is separated. The method to separate into each individual semiconductor device 20 includes dicing, etching, laser cutting and the like. The semiconductor device according to the embodiment is thereby completed.

The completed semiconductor device 20 is mounted on a circuit board on which electrodes are formed. The conductive terminals 12 are electrically connected with corresponding electrodes on the circuit board as the semiconductor device 20 is mounted on the printed circuit board. In the case where the conductive terminal 12 is not formed in the semiconductor device 20, the metal layer 9 or the pad electrode 4 is connected with each electrode on the circuit board directly or through a conductive material such as a bonding wire. Structures in which the conductive terminal 12 is not formed and the pad electrode 4 is connected with the electrode on the circuit board are shown in FIGS. 12A through 13B that are to be described.

Figure 22:
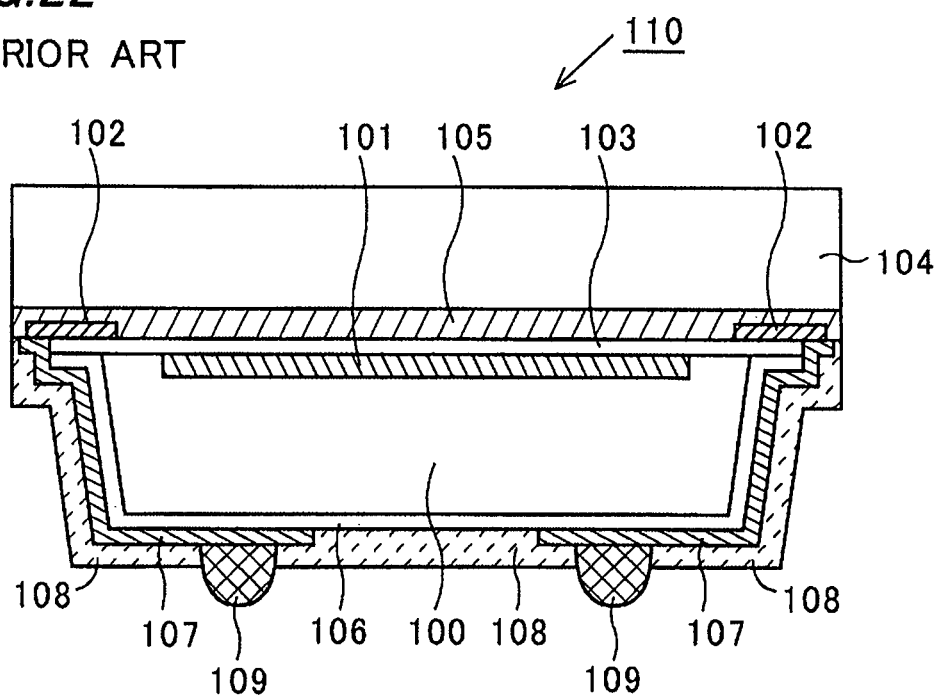
FIG. 22 is a cross-sectional view showing a conventional semiconductor device.

According to the first embodiment, there is no need for process steps to form the wiring layer 107 and the second insulation film 106 disposed on the side surface and the back surface of the semiconductor substrate, which form the conventional semiconductor device 110 as shown in FIG. 22. As a result, the manufacturing process is simplified to enhance the productivity while the manufacturing cost is reduced.

Also in the semiconductor device according to this embodiment, the conductive terminals 12 are not disposed on the back surface of the semiconductor substrate 2, but are disposed on the periphery of the supporter 7 so that the conductive terminals 12 are adjacent the sidewalls of the semiconductor substrate 2. As a result, assuming the height of the conductive terminals 12 is the same as that of the conventional semiconductor device, the thickness of the semiconductor device according to the first embodiment can be reduced by the height of the conductive terminals compared with the conventional semiconductor device, making it possible to reduce the size of the semiconductor device.

Figure 7:
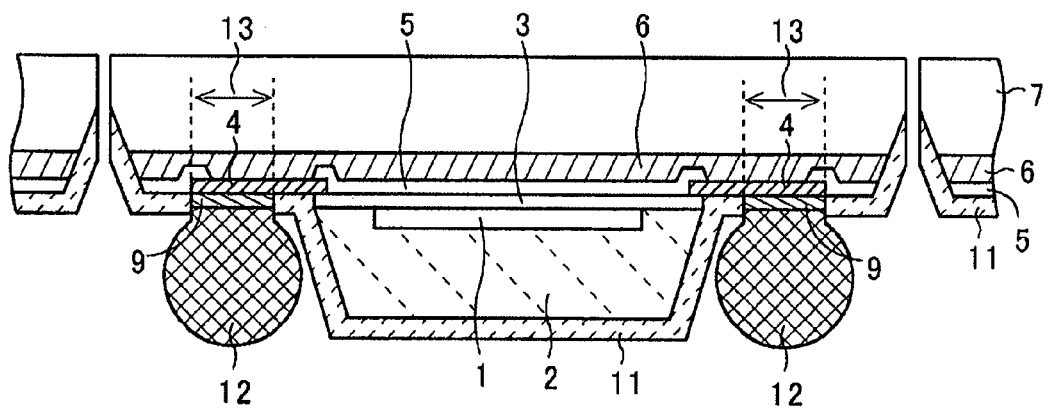
FIG. 7 is a cross-sectional view showing the semiconductor device and its manufacturing method according to the first embodiment of this invention.

Although an edge of the semiconductor substrate 2 and an edge of the pad electrode 4 are apart in the explanation described above, it is also possible to etch the semiconductor substrate 2 so that the edge of the pad electrode 4 is disposed above a portion of the top surface of the semiconductor substrate 2. The pad electrode 4 and the semiconductor substrate 2 may overlap to the extent that a portion (hereafter referred to as an electrode connecting portion 13) of the pad electrode 4 corresponding to the metal layer 9 or the conductive terminal 12 that is to be formed, or corresponding to the electrode of the another device does not overlap the semiconductor substrate 2. Therefore, if an area of the pad electrode 4 is large and only a portion of the pad electrode 4 makes the electrode connecting portion 13, the semiconductor substrate 2 may be etched so that the edge of the semiconductor substrate 2 overlaps with the edge of the pad electrode 4, as shown in FIG. 7.

Figure 8:
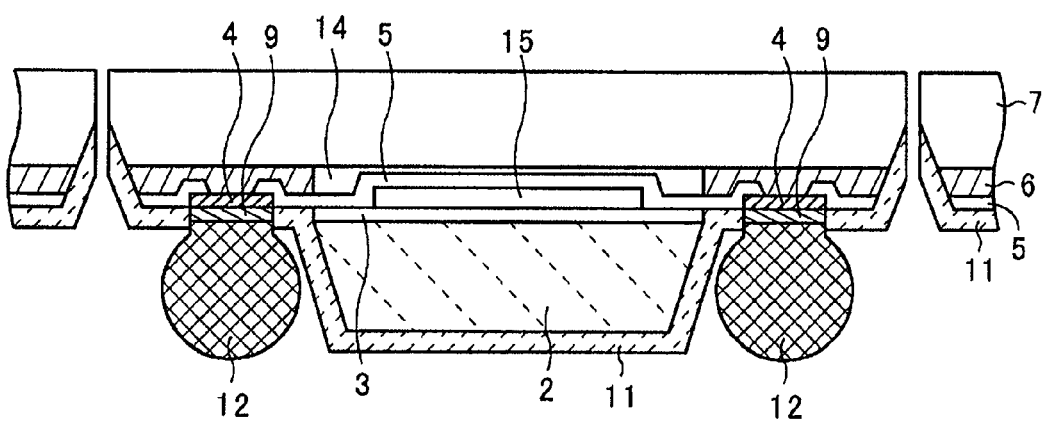
FIG. 8 is a cross-sectional view showing the semiconductor device and its manufacturing method according to the first embodiment of this invention.

Although the adhesive layer 6 is uniformly formed between the semiconductor substrate 2 and the supporter 7 in the explanation described above, the adhesive layer 6 may be formed partially. For example, the adhesive layer 6 may be formed in a shape of a ring to form a cavity 14 between the semiconductor substrate 2 and the supporter 7, as shown in FIG. 8. The cavity 14 means an inner space between the semiconductor substrate 2 and the supporter 7. FIG. 8 shows an electronic device such as a MEMS (Micro Electro Mechanical Systems) device 15 disposed on the semiconductor substrate 2 through the insulation film 3 taking advantage of the cavity 14. A MEMS is a device in which a mechanical component, a sensor, an actuator, an electronic circuit and the like are integrated on a semiconductor substrate. The MEMS device 15 is electrically connected with the pad electrode 4 through a wiring that is not shown in the figure.

In some cases, operation quality of a semiconductor device is improved by not forming the adhesive layer 6 on the device component as described above. When there is formed a light-receiving device or a light-emitting device, for example, its operation quality is improved because there is no unnecessary intervening material on it. A height and an area of the cavity 14 may be adjusted by varying a thickness and an area of the adhesive layer 6.

Figure 9:
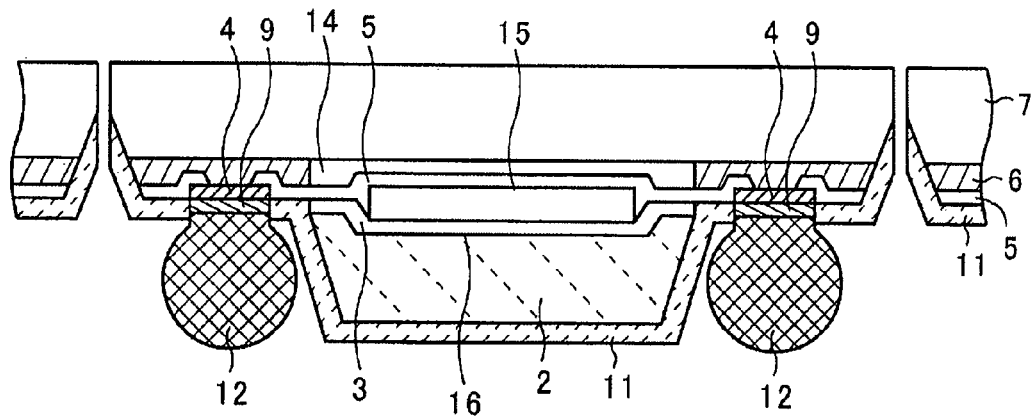
FIG. 9 is a cross-sectional view showing the semiconductor device and its manufacturing method according to the first embodiment of this invention.

Also, various devices including the MEMS device 15 may be disposed in a bottom 16 of a dent 16 that is formed in the top surface of the semiconductor substrate 2 by etching, for example, as shown in FIG. 9. A thicker device can be disposed in the structure described above compared with the structure shown in FIG. 8, since a spacing between the semiconductor substrate 2 and the supporter 7 is extended by a depth of the dent 16. The height of the cavity 14 can be more freely adjusted by combining adjusting the depth of the dent 16 and adjusting the thickness of the adhesive layer 6.

Figure 10:
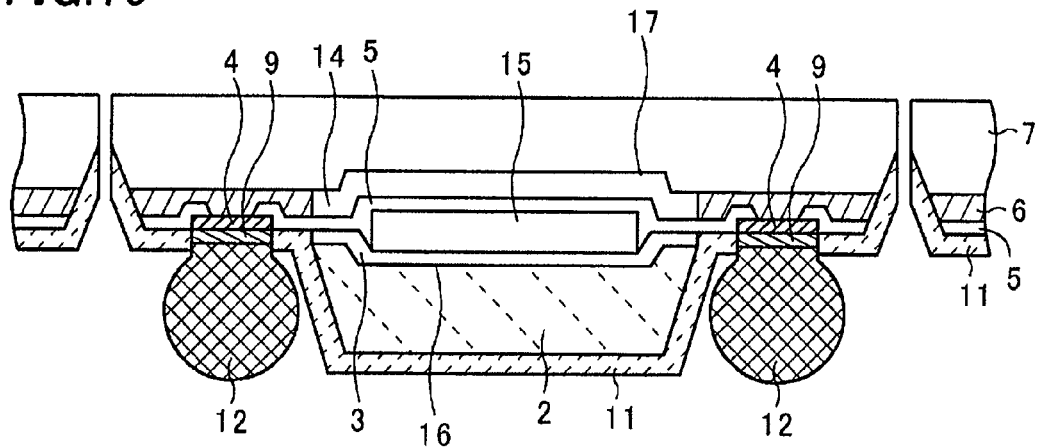
FIG. 10 is a cross-sectional view showing the semiconductor device and its manufacturing method according to the first embodiment of this invention.

In addition, a dent 17 may be formed in a region facing the device component such as the MEMS device 15 in a surface of the supporter 7 facing the semiconductor substrate 2 by etching, laser beam radiation, micro-blasting or the like, as shown in FIG. 10. An even thicker device can be disposed in the structure described above compared with the structures shown in FIG. 8 and in FIG. 9, since the spacing between the semiconductor substrate 2 and the supporter 7 is even more extended to enable adjusting the cavity 14 even more freely. The micro-blasting is a method to process an object by blasting the object with fine particles of alumina, silica or the like.

The supporter 7 bonded to the semiconductor substrate 2 in the first embodiment may be separated from the semiconductor substrate 2 before or after the dicing by providing the adhesive layer 6 with solvent, for example. The separated supporter 7 can be reused.

Figure 11A:
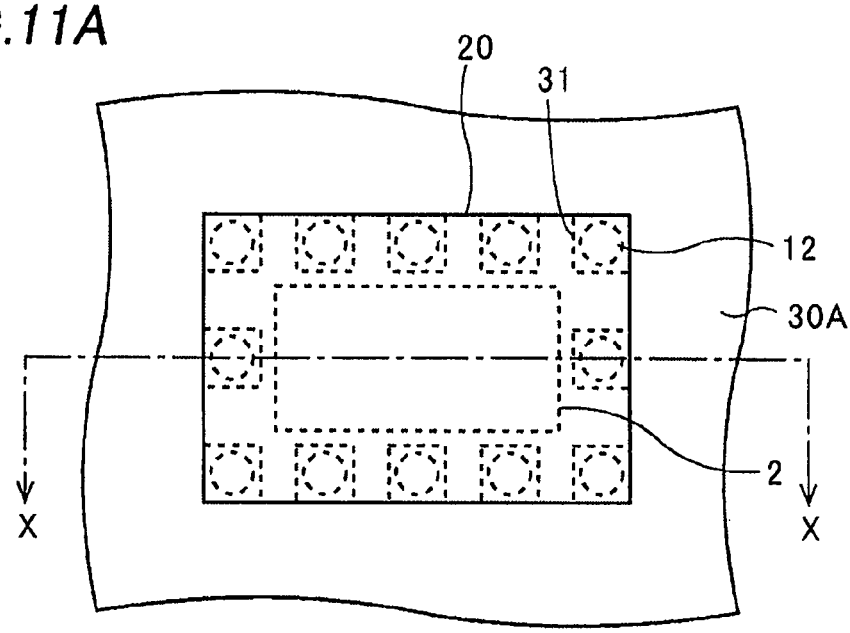
FIG. 11A is a plan view showing the semiconductor device according to the first embodiment of this invention.
Figure 11B:
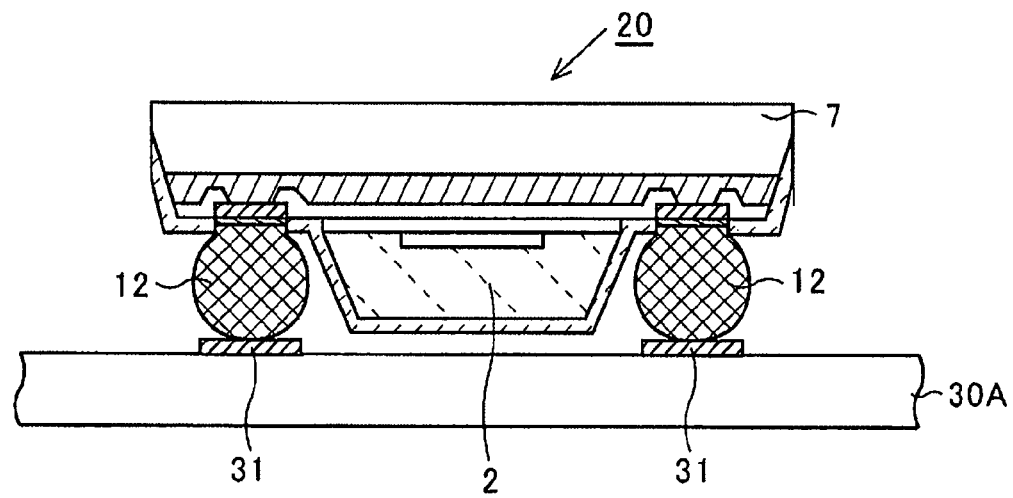
FIG. 11B is a cross-sectional view showing the semiconductor device mounted on a circuit board.

Next, a case in which a semiconductor device according to the first embodiment of this invention is mounted on a circuit board (a module substrate) will be explained hereinafter, referring to the drawings. FIG. 11A is a plan view seen from above of a device in which a semiconductor device 20 according to the first embodiment is mounted. FIG. 11B is a cross-sectional view of a section X-X shown in FIG. 11A. The same components as those shown in the preceding drawings are denoted by the same symbols, and explanations on them are omitted.

The semiconductor device 20 is mounted on a circuit board 30A such as a printed circuit board, for example, as shown in FIG. 11A. The semiconductor device 20 is mounted so that a side of its back surface (a side on which the supporter 7 is not formed) faces the circuit board 30A. Electrodes 31 are formed on the circuit board 30A at locations corresponding to conductive terminals 12 of the semiconductor device 20.

Each of the conductive terminals 12 is electrically connected with corresponding each of the electrodes 31, respectively. Because no conductive terminals are formed on the back surface of the semiconductor substrate, not as in the conventional semiconductor device 110 shown in FIG. 22 as described above, the device as a whole can be made thinner.

Figure 12A:
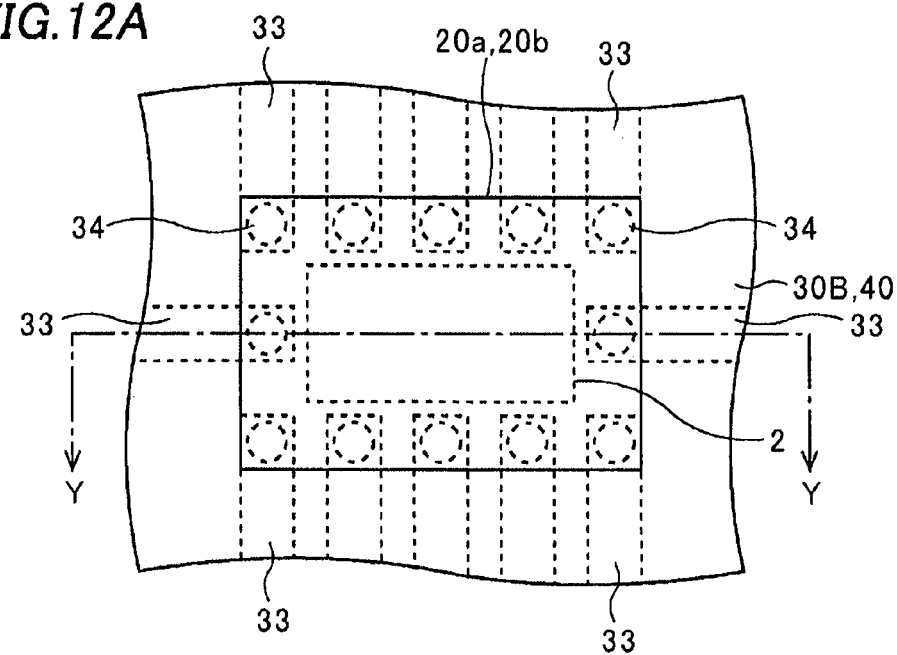
FIG. 12A is a plan view showing the semiconductor device according the first embodiment of this invention.
Figure 12B:
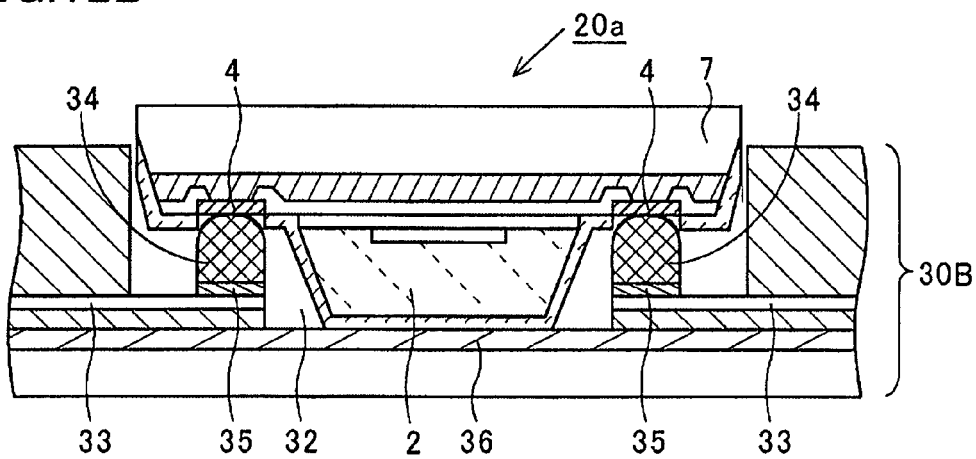
FIG. 12B is a cross-sectional view showing the semiconductor device mounted on a circuit board.
Figure 13A:
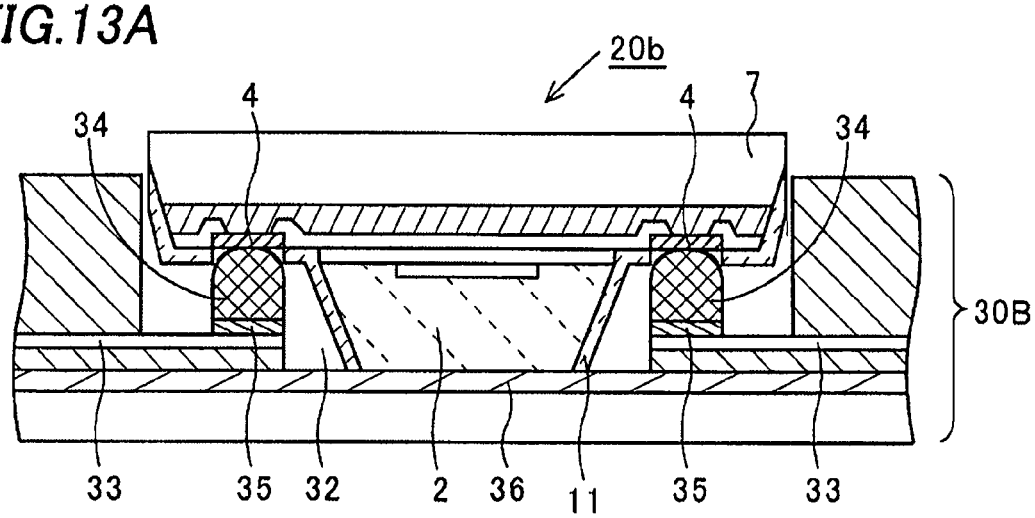
FIGS. 13A and 13B are cross-sectional views showing the semiconductor device according to the first embodiment of this invention mounted on a circuit board.
Figure 13B:
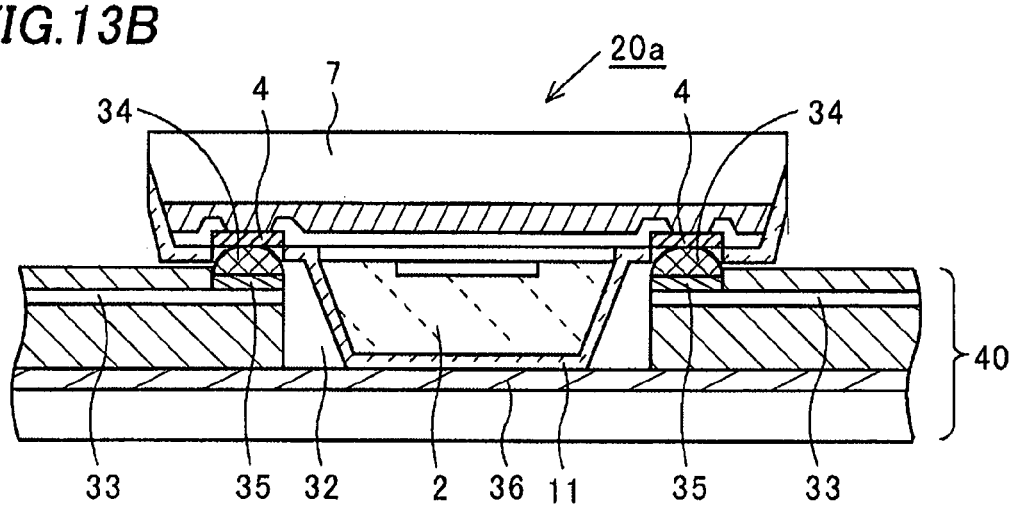

The semiconductor device according to the first embodiment may also be mounted on a circuit board in other ways as shown in FIGS. 12A, 12B, 13A and 13B. FIG. 12A is a plan view seen from above of a device in which a semiconductor device 20a or 20b according to the first embodiment is mounted on a circuit board 30B or 40. FIGS. 12B, 13A and 13B are cross-sectional views of a section Y-Y shown in FIG. 12A. No conductive terminals 12 are formed and the pad electrodes 4 are exposed in the semiconductor devices 20a and 20b. The same components as those shown in the preceding drawings are denoted by the same symbols, and explanations on them are omitted.

A space (fitting portion) 32 corresponding to a shape of the semiconductor device 20a is formed in a surface of the circuit board 30B such as a printed circuit board, as shown in FIG. 12B. The semiconductor device 20a is mounted so as to be embedded in the fitting portion 32. The fitting portion 32 is formed by etching with laser radiation or by cutting with a drill, for example.

Wiring layers 33 made of copper, aluminum or the like are formed as wirings in the circuit board 30B. A conductive terminal 34 is formed on each wiring layer 33 through a metal layer 35 as an electrode on a side of the circuit board 30B. Each of the conductive terminals 34 is electrically connected with corresponding each of pad electrodes 4 in the semiconductor device 20a.

The conductive terminal 34 on the circuit board 30B is structured similar to the conductive terminal 12 in the semiconductor device 20 shown in FIG. 6, and the metal layer 35 is structured similar to the metal layer 9 in the semiconductor device 20. Or, the metal layer 9 may be formed on the pad electrode 4 in the semiconductor device 20a and the metal layer 9 may be interposed between the pad electrode 4 and the conductive terminal 34.

It is preferable that a heat dissipation layer 36 of high thermal conductivity (copper layer, for example) is formed at a bottom of the fitting portion 32, as shown in FIG. 12B. By providing a contact plane between the circuit board 30B and the semiconductor device 20a with the heat dissipation layer 36 as described above, heat generated during operation of the semiconductor device 20a can be transferred to the heat dissipation layer 36 and be expelled. As a result, deterioration of the device component such as a transistor due to the heat can be effectively prevented. Also, a dark current can be reduced. Especially for a device such as a CCD, electrical characteristics of which are easily deteriorated by heat, deterioration in performance is prevented and operation quality is improved compared with a structure without the heat dissipation layer 36.

For better heat dissipation and higher operation quality, a semiconductor device 20b may be structured to have no protection layer 11 formed on the back surface of the semiconductor substrate 2, as shown in FIG. 13A. This structure can be obtained by removing the protection layer on the back surface of the semiconductor substrate 2 at the same time as the opening on the pad electrode 4 or on the metal layer 9 is formed. The heat dissipation is high with the structure described above, because the heat generated during the operation can be directly transferred from the back surface of the semiconductor substrate 2 to the heat dissipation layer 36.

The metal layers 35 and the conductive terminals 34 on the side of the circuit board may be disposed on upper portions of a circuit board 40, as shown in FIG. 13B. Forming the conductive terminals 34 on the upper portions of the circuit board 40 is easier than forming the conductive terminals 34 deep inside the fitting portion 32.

Although not shown in the figure, heat dissipation effect can be obtained without forming the dissipation layer 36 by slightly separating the back surface of the semiconductor device from the circuit board.

Although a surface of the heat dissipation layer 36 is directly touching the semiconductor device 20a or 20b in the structures shown in FIGS. 12B, 13A and 13B, an insulation film such as a silicon oxide film, a silicon nitride film or a resin film may be formed on the heat dissipation layer 36 in the circuit board 30B or 40.

Figure 14A:
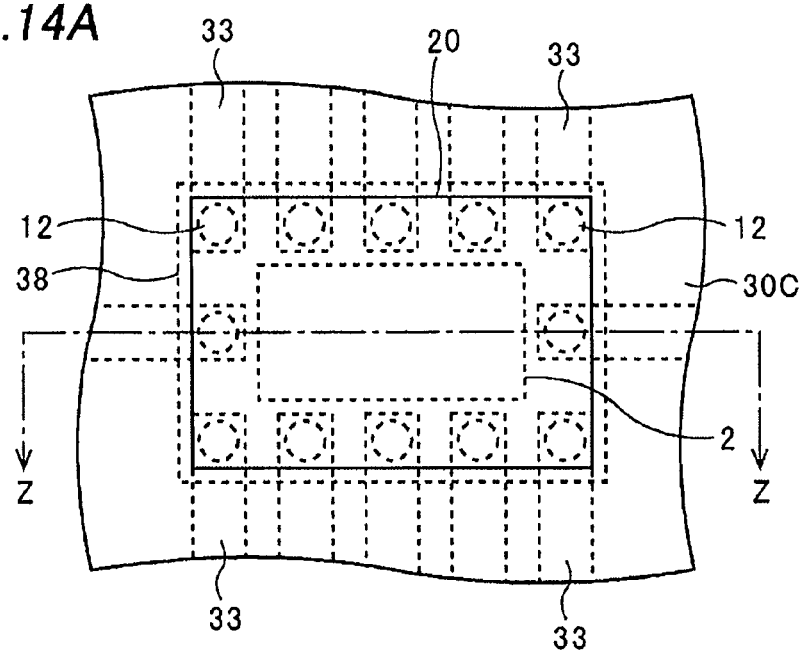
FIG. 14A is a plan view showing the semiconductor device according the first embodiment of this invention.
Figure 14B:
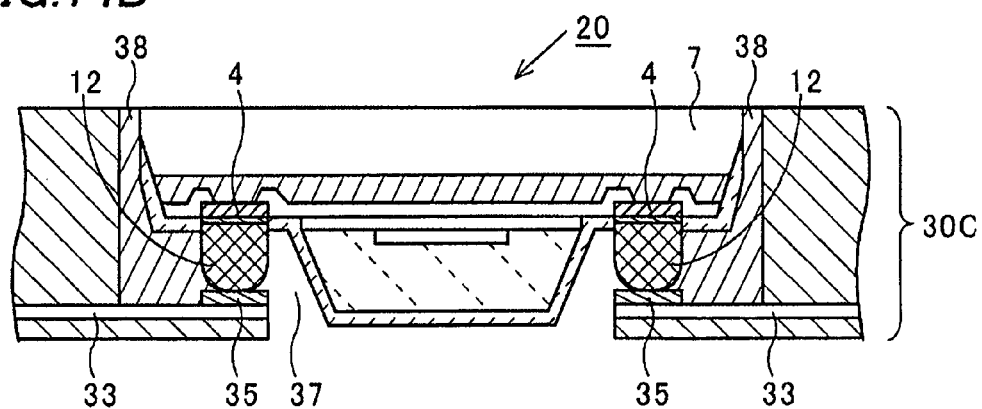
FIG. 14B is a cross-sectional view showing the semiconductor device mounted on a circuit board.

The semiconductor device according to the first embodiment may also be mounted on a circuit board in another way as shown in FIGS. 14A and 14B. FIG. 14A is a plan view seen from above of a device in which a semiconductor device 20 according to the first embodiment is mounted on a circuit board 30C. FIG. 14B is a cross-sectional view of a section Z-Z shown in FIG. 14A. The same components as those shown in the preceding drawings are denoted by the same symbols, and explanations on them are omitted.

A space (fitting portion) 37 corresponding to the shape of the semiconductor device 20 is formed in the circuit board 30C, as shown in FIG. 14B. The fitting portion 37 penetrates the circuit board 30C. The semiconductor device 20 is embedded in the fitting portion 37 and a back surface of the semiconductor device 20 is exposed out of the circuit board 30C. The fitting portion 37 is formed by etching with laser radiation or by cutting with a drill, for example.

Each of wiring layers 33 formed in the circuit board 30C is connected with corresponding each of conductive terminals 12 in the semiconductor device 20. When there is a gap between a sidewall of the fitting portion 37 in the circuit board 30C and the semiconductor device 20 mounted on it, the gap is filled with underfill 38 made of epoxy resin, for example, in order to insure a good fit by filling the gap.

Although the circuit board 30C does not have the heat dissipation layer 36 unlike the circuit board 30B, the heat generated during the operation can be expelled by mounting the semiconductor device 20 so that a bottom of the semiconductor device 20 is exposed to the outside. As a result, deterioration of the device component due to the heat during the operation can be effectively prevented.

Next, a second embodiment of this invention will be explained referring to the figures hereinafter. When a stacked structure of semiconductor devices is implemented, it is necessary to reduce a height of the stacked structure as much as possible to reduce a size of the stacked structure.

Considering the above, the second embodiment of this invention adopts manufacturing steps suitable for manufacturing a semiconductor device for stacking in addition to the manufacturing steps for the semiconductor device according to the first embodiment. Detailed description is given below. The same structures as those in the first embodiment are denoted by the same symbols and explanation on them are simplified or omitted.

Figure 15:
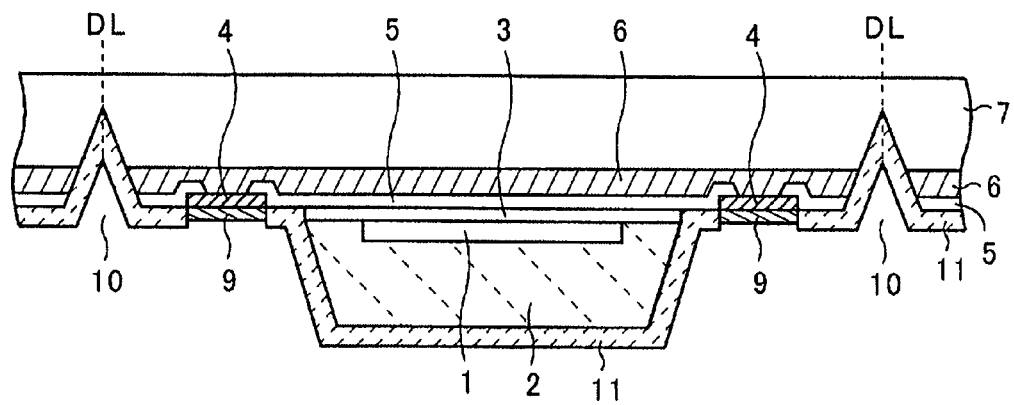
FIG. 15 is a cross-sectional view showing a semiconductor device and its manufacturing method according to a second embodiment of this invention.

A semiconductor substrate 2, on a top surface of which pad electrodes 4 are formed through a first insulation film 3, is provided. A supporter 7 is bonded to the top surface of the semiconductor substrate 2 through an adhesive layer 6, as shown in FIG. 15. Next, the first insulation film 3 is partially removed by etching from a back surface side of the semiconductor substrate 2 to expose the pad electrodes 4. Then, a metal layer 9 is formed on each of the exposed pad electrodes 4.

Notches 10 are formed along dicing lines DL by dicing with a dicing blade or etching from a side of the semiconductor substrate 2. A protection layer 11 having openings at locations corresponding to the metal layers 9 is formed. The process steps described above are similar to those described in the first embodiment.

Figure 16:
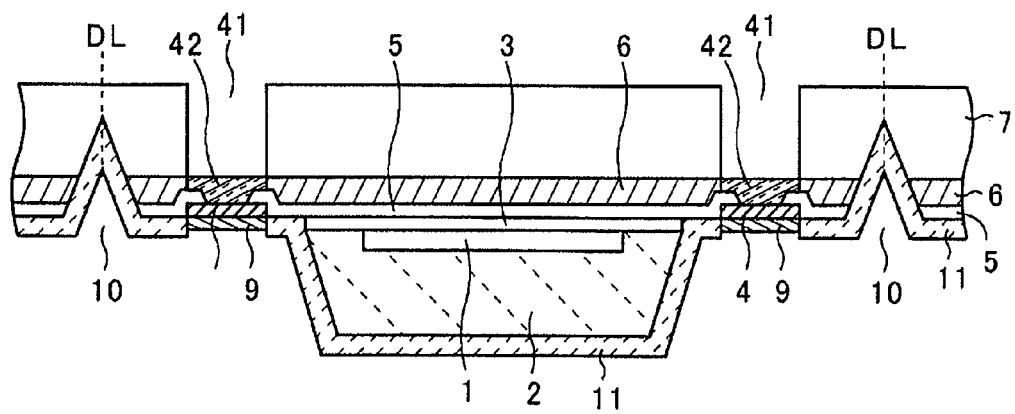
FIG. 16 is a cross-sectional view showing the semiconductor device and its manufacturing method according to the second embodiment of this invention.

Next, through-holes 41 that penetrate the supporter 7 and expose the pad electrodes 4 from a side of the supporter 7 are formed at locations corresponding to the pad electrodes 4, as shown in FIG. 16. To describe more concretely, a photoresist layer is formed on a surface of the supporter 7, the supporter 7 is selectively etched using the photoresist layer as a mask to expose the adhesive layer 6, and the adhesive layer 6 is etched. The through-hole 41 is a square in shape with each side of about 100 µm, for example.

Next, a metal layer 42 is formed on the pad electrode 4 exposed at the bottom of the through-hole 41 The metal layer 42 is similar in the structure to the metal layer 9, and is made of a nickel (Ni) layer and a gold (Au) layer stacked consecutively, for example. With this, each of the metal layers 9 and 42 is formed on each of principal surfaces of the pad electrode 4 respectively.

Figure 17:
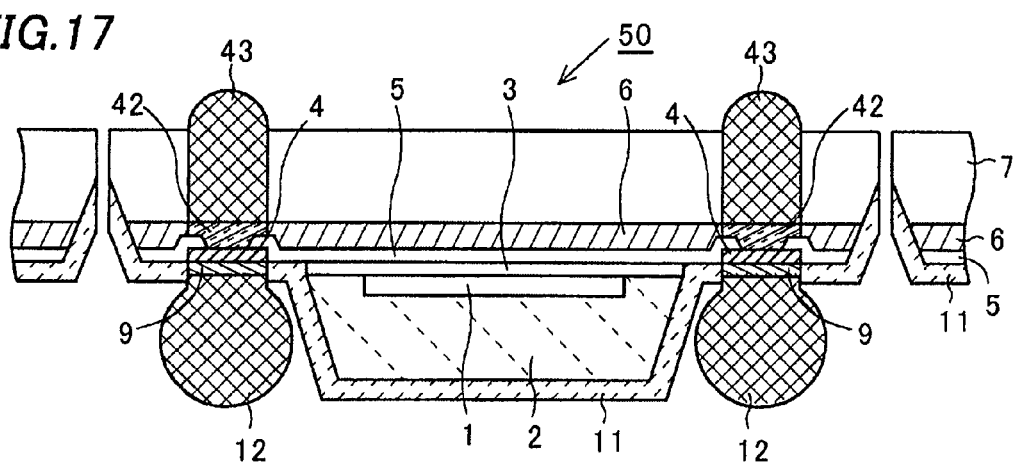
FIG. 17 is a cross-sectional view showing the semiconductor device and its manufacturing method according to the second embodiment of this invention.

Next, a conductive terminal 12 and a conductive terminal 43 are simultaneously formed on the metal layer 9 and on the metal layer 42, respectively, by electrolytic plating using the metal layer 9 exposed on the side of the semiconductor substrate 2 and the metal layer 42 exposed on the side of the supporter 7 as plating electrodes, as shown in FIG. 17. The manufacturing process is rationalized by forming both the conductive terminals 12 and 43 simultaneously as described above. As in the first embodiment, the method to form the conductive terminals 12 and 43 is not limited to the above.

Finally, the supporter 7 is divided along the dicing lines DL so that each individual semiconductor device 50 is separated. The semiconductor device according to the second embodiment is thereby completed. The completed semiconductor device 50 is mounted through the conductive terminals 12 or the conductive terminals 43 on a circuit board on which electrodes are formed.

Figure 18:
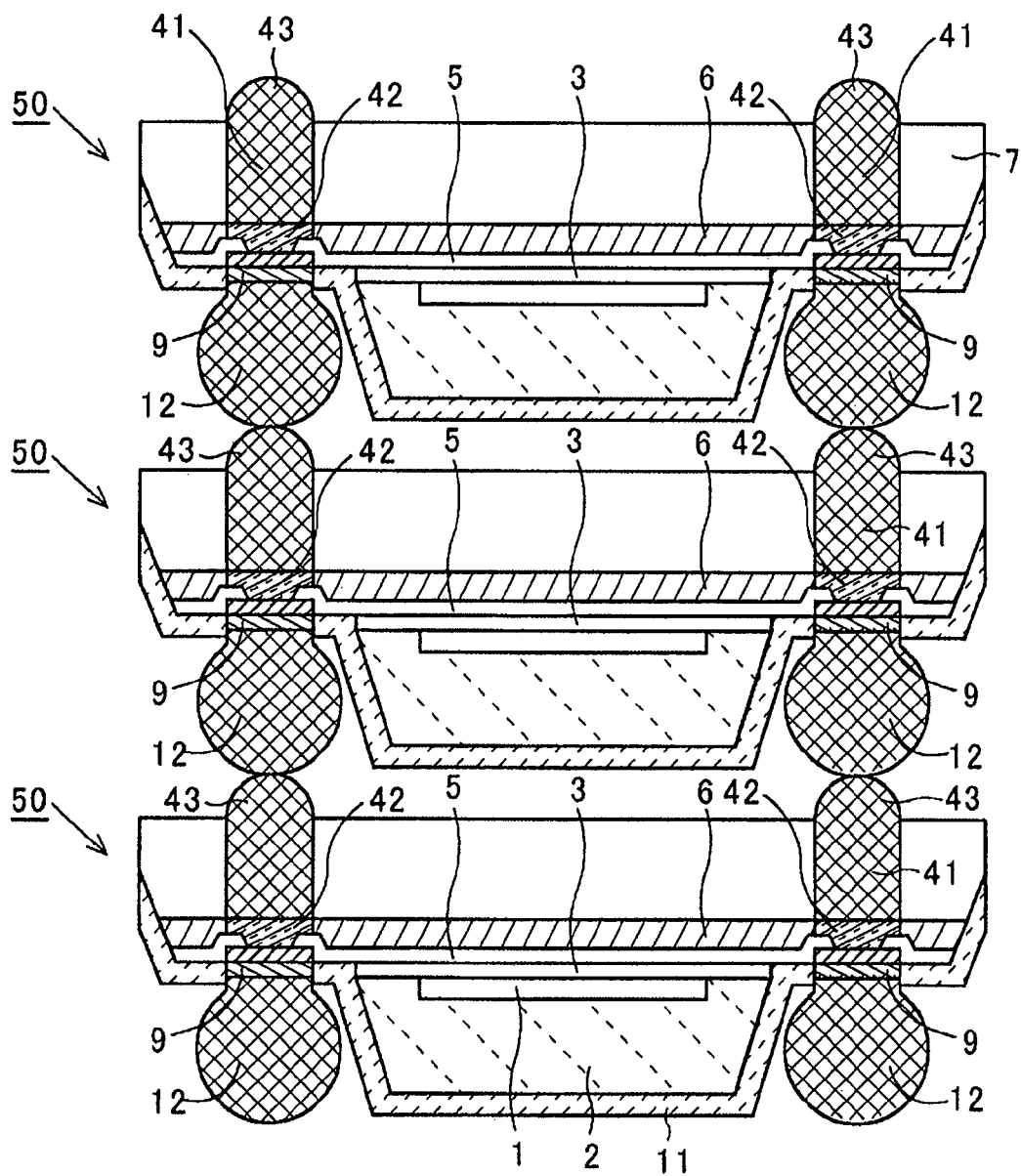
FIG. 18 is a cross-sectional view showing a stacked structure of the semiconductor devices according to the second embodiment of this invention.

A stacked structure can be implemented by stacking a plurality of the completed semiconductor devices 50 so that each of the conductive terminals 12 is aligned with underlying each of the conductive terminals 43 as shown in FIG. 18, and by thermo-compression bonding the conductive terminals 12 and 43, for example. FIG. 18 shows, as an example, the stacked structure in which three semiconductor devices 50 are stacked.

As described above, the second embodiment of this invention has advantages that the productivity is enhanced while the manufacturing cost is reduced, because the second embodiment also does not need the process steps to form the wiring layer 107 and the second insulation film 106, which are required in the conventional art. In addition, since the top surface of the semiconductor substrate 2 is protected with the supporter 7, deterioration of a device component 1 formed in the top surface and its peripheral component can be prevented to enhance reliability of the semiconductor device.

The stacked structure can be implemented by connecting the vertically neighboring conductive terminals 12 and 43 with each other through the through-hole 41 formed in the supporter 7, making it possible to minimize the height of the stacked structure. Also, workability and efficiency are high because the stacking with another device becomes ready as soon as the semiconductor device 50 is completed. The another device mentioned above may be the semiconductor device 50 having the structure shown in FIG. 18 or a semiconductor device having a different structure, and its structure and function are not limited.

Figure 19:
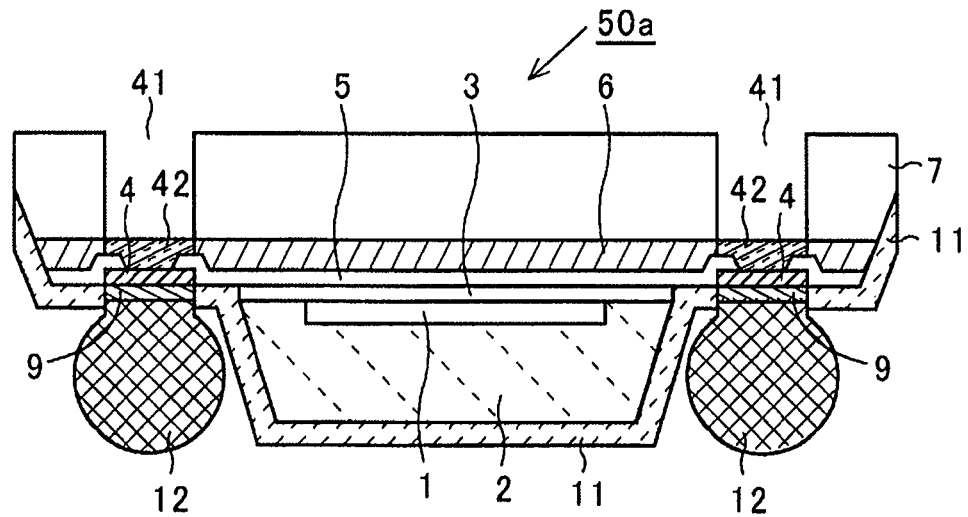
FIG. 19 is a cross-sectional view showing the semiconductor device according to the second embodiment of this invention.

In some cases, either or both of the conductive terminals 12 on the side of the semiconductor substrate 2 and the conductive terminals 43 in the through-holes 41 are not formed. In the case where the conductive terminals 12 are formed but the conductive terminals 43 in the through-holes 41 are not formed, the metal layers 42 or the pad electrodes 4 are exposed in the through-holes 41, as shown in FIG. 19. The conductive terminals 12 are electrically connected with electrodes in another device under the semiconductor device 50a, while the metal layers 42 in the through-holes 41 or the pad electrodes 4 are electrically connected with electrodes in another device over the semiconductor device 50a.

Figure 20:
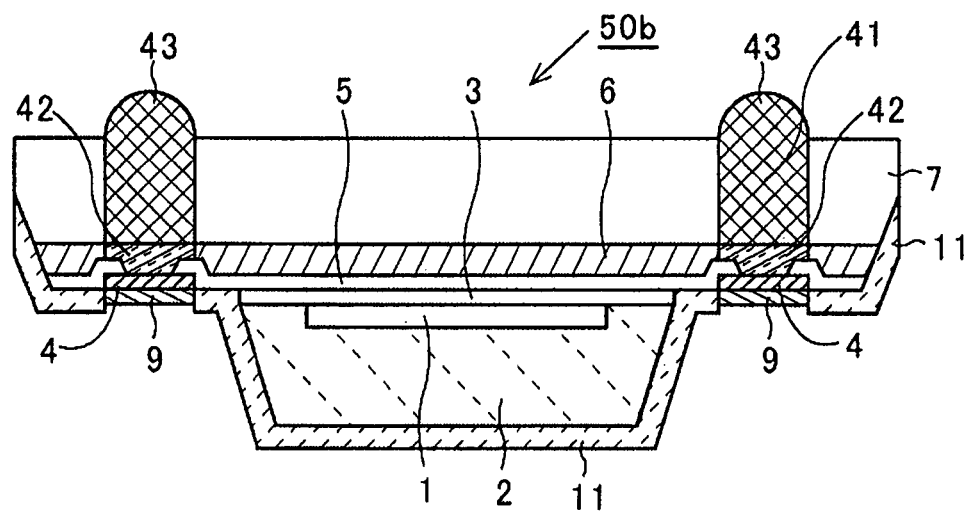
FIG. 20 is a cross-sectional view showing the semiconductor device according to the second embodiment of this invention.

In the case where the conductive terminals 12 are not formed but the conductive terminals 43 are formed in the through-holes 41, the conductive terminals 43 are connected with electrodes in another device over a semiconductor device 50b, while the metal layers 9 or the pad electrodes 4 are connected with electrodes in another device under the semiconductor device 50b, as shown in FIG. 20.

The through-holes 41, the metal layers 42 and the conductive terminals 43 are formed in the supporter 7 at the locations corresponding to the pad electrodes 4, the metal layers 9 and the conductive terminals 12 in the second embodiment described above. However, the locations are not limited to the above and they may be formed any locations as long as they could serve the connection with the electrodes in the another device over the semiconductor device 50. As a result, overlaying a semiconductor device of different function or size is made possible.

Although the semiconductor devices are BGA (Ball Grid Array) type semiconductor devices that have ball-shaped conductive terminals 12 or 42 in the embodiments described above, the embodiments of this invention may be applied to semiconductor devices of other types such as LGA (Land Grid Array) type, CSP (Chip Size Package) type and flip-chip type that have no ball-shaped conductive terminals.

Also, this invention is not limited to the embodiments described above and may be modified within the scope of the invention.

Figure 21A:
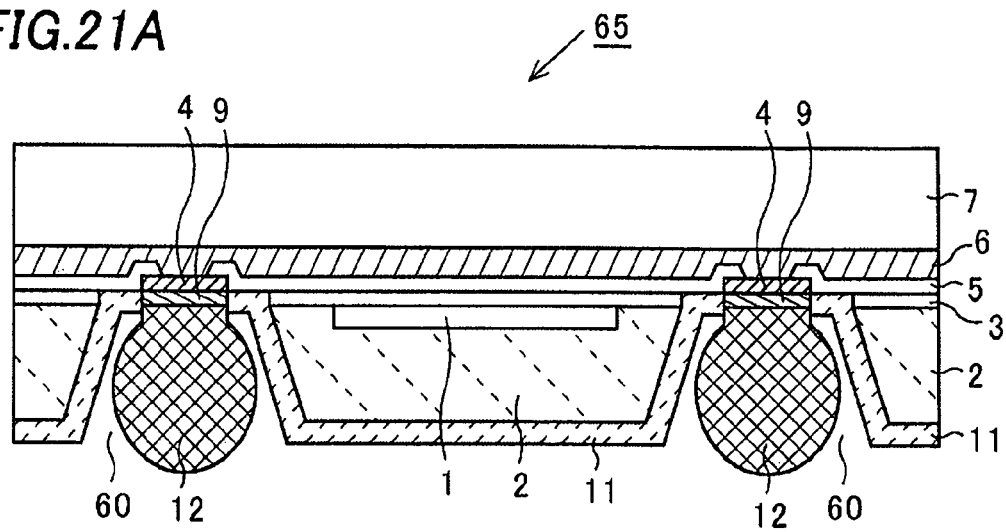
FIGS. 21A and 21B are a cross-sectional view and a plan view, respectively, showing a semiconductor device according to a modification to the first embodiment of this invention.
Figure 21B:
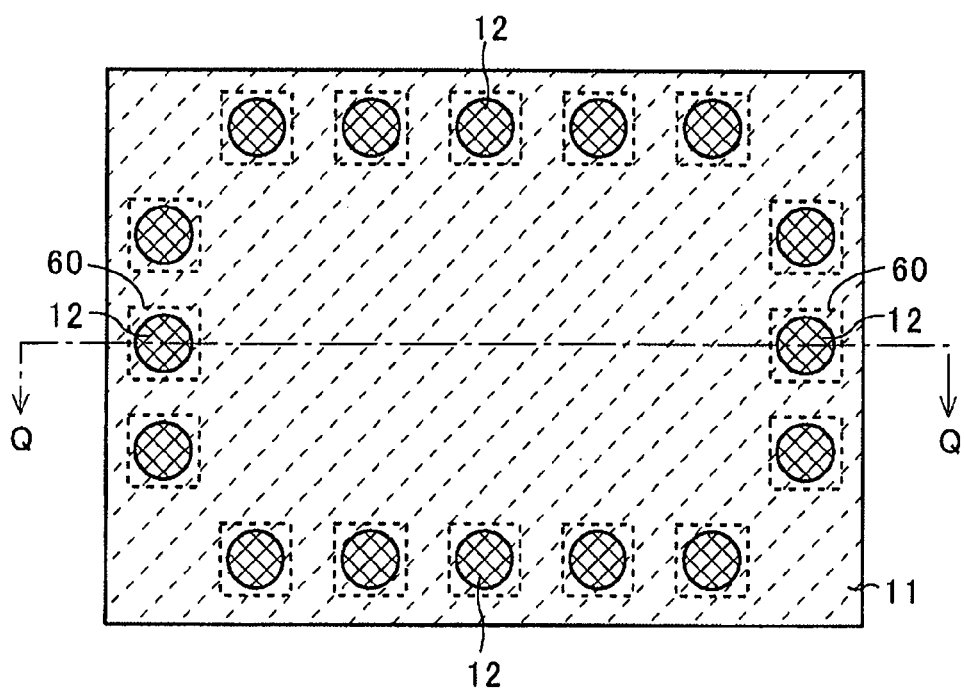

For example, openings 60 may be formed in a semiconductor substrate 2 in a semiconductor device 65 as shown in FIG. 21A by modifying etching pattern of the semiconductor substrate 2 and locations of dicing lines. FIG. 21B is a plan view of the semiconductor device 65 seen from a back surface side, showing conductive terminals 12 formed in the openings 60. FIG. 21A is a cross-sectional view of a section Q-Q in FIG. 21B.

The openings 60 are surrounded by the semiconductor substrate 2. Conductive terminals 12 may be formed in the openings 60. The conductive terminals 12 in the semiconductor device 65 of the modified example are exposed toward the back surface side but not exposed toward a side surface side. As a result, infiltration of contaminating material and mechanical damage are reduced to improve the reliability of the semiconductor device.

Although a height of the conductive terminals 12 in the semiconductor device 65 is formed to be slightly larger than a thickness of the semiconductor substrate 2, the height may be modified arbitrarily. For example, when electrodes in another device to which the conductive terminals 12 are to be connected are protruding, the height of the conductive terminals 12 may be made smaller than the thickness of the semiconductor substrate 2. Although the conductive terminals 12 are formed along a periphery of the semiconductor device 65 shown in FIGS. 21A and 21B, the locations of the openings 60 and the conductive terminals 12 may be changed according to locations of the pad electrodes 4 and the metal layers 9.

In the case where the conductive terminals 12 are not formed in the semiconductor device 65, the metal layers 9 or the pad electrodes 4 are exposed in the openings 60 and are electrically connected with the electrodes in another device through the openings 60. It is also possible that the supporter 7 in the semiconductor device 65 is provided with through-holes as described above and that a stacked structure as shown in FIG. 18 is formed using the semiconductor devices 65.

The notch 10 may be not formed as in the semiconductor device 65 shown in FIG. 21. Note that the same structures in FIG. 21 as those already described above are denoted by the same symbols and explanations on them are omitted.

Although the semiconductor substrate 2 in FIGS. 11A, 12A and 14A is depicted as a rectangle as in FIG. 3A, it may be shaped to have rugged periphery as shown in FIG. 3B or may be modified into a shape in accordance with a design.

With the embodiments of this invention, the manufacturing cost of the semiconductor device can be reduced because the manufacturing process is simplified while use of the metallic material such as aluminum, aluminum alloy or copper required to form the wirings is suppressed. In addition, the thickness and the size of the semiconductor device can be reduced.

Furthermore, in the case where the through-holes are formed in the supporter that is bonded to the semiconductor substrate, the semiconductor device can be electrically connected with another device through the through-holes. As a result, the stacked structure of a plurality of the semiconductor devices can be implemented while the stacked structure can be reduced in the thickness and the size.

What is claimed is:
1. A semiconductor device comprising:
a semiconductor substrate comprising a top surface and a bottom surface;
a supporter, a first surface of which is attached to the top surface of the semiconductor substrate so that an edge portion of the semiconductor substrate recedes from a corresponding edge portion of the supporter;
a connecting electrode disposed on the first surface of the supporter;

a protection layer covering a side surface of the semiconductor substrate and having an opening at the connecting electrode; and a passivation film covering a portion of the connecting electrode so that the covering portion of the passivation film is disposed between the supporter and the connecting electrode, wherein no wiring layer is formed on the bottom surface of the semiconductor substrate, and the passivation film comprises an insulating material and is disposed between the semiconductor substrate and the supporter.

2. The semiconductor device of claim 1, wherein the opening of the protection layer is located over a first principal surface of the connecting electrode, and a second principal surface of the connecting electrode faces the supporter.

3. The semiconductor device of claim 1, further comprising a conductive terminal disposed on the connecting electrode.

4. The semiconductor device of claim 1, wherein the supporter has a through-hole penetrating through the supporter.

5. The semiconductor device of claim 4, wherein the through-hole is formed at a location over the connecting electrode.

6. The semiconductor device of claim 4, further comprising a conductive material disposed in the through-hole of the supporter.

7. The semiconductor device of claim 1, wherein the bottom surface of the semiconductor substrate is not covered with the protection layer.

8. The semiconductor device of claim 1, further comprising an adhesive layer connecting the first surface of the supporter and the top surface of the semiconductor substrate so that a cavity is formed between the semiconductor substrate and the supporter.

9. A stacked semiconductor device comprising:
a first semiconductor device; and
a second semiconductor device stacked on the first semiconductor device, wherein each of the semiconductor devices comprises;
 a semiconductor substrate comprising a top surface and a bottom surface,
 a supporter, a first surface of which is attached to the top surface of the semiconductor substrate so that an edge portion of the semiconductor substrate recedes from a corresponding edge portion of the supporter,
 a connecting electrode disposed on the first surface of the supporter, and
 a protection layer covering a side surface of the semiconductor substrate and having an opening at the connecting electrode, and
 a passivation film covering a portion of the connecting electrode so that the covering portion of the passivation film is disposed between the supporter and the connecting electrode, the passivation film comprising an insulating material and being disposed between the semiconductor substrate and the supporter,
 wherein no wiring layer is formed on the bottom surface of the semiconductor substrate and the supporter has a through-hole penetrating through the supporter, and
the connecting electrode of the first semiconductor device is connected electrically with the connecting electrode of the second semiconductor device.

10. The semiconductor device of claim 1, further comprising a circuit board on which the semiconductor substrate attached to the supporter is mounted.

11. The semiconductor device of claim 1, wherein the passivation film comprises a silicon nitride film.

* * * * *